United States Patent
Yoshida

(10) Patent No.: US 7,064,389 B2
(45) Date of Patent: *Jun. 20, 2006

(54) SEMICONDUCTOR MEMORY DEVICE HAVING FULL DEPLETIVE TYPE LOGIC TRANSISTORS AND PARTIAL DEPLETION TYPE MEMORY TRANSISTORS

(75) Inventor: Masahiro Yoshida, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 128 days.

This patent is subject to a terminal disclaimer.

(21) Appl. No.: 10/969,906

(22) Filed: Oct. 22, 2004

(65) Prior Publication Data

US 2005/0082617 A1 Apr. 21, 2005

Related U.S. Application Data

(62) Division of application No. 10/059,125, filed on Jan. 31, 2002, now Pat. No. 6,809,381.

(30) Foreign Application Priority Data

Oct. 12, 2001 (JP) ............................. 2001-313593

(51) Int. Cl.
*H01L 31/0392* (2006.01)
(52) U.S. Cl. .................... 257/348; 257/350; 257/392
(58) Field of Classification Search ............... 257/348, 257/350, 392, 349, 347, 402
See application file for complete search history.

(56) References Cited

U.S. PATENT DOCUMENTS

| | | | |
|---|---|---|---|
| 5,674,760 A | 10/1997 | Hong | |
| 6,208,010 B1 | 3/2001 | Nakazato et al. | |
| 6,215,155 B1 | 4/2001 | Wollesen | |
| 6,407,427 B1 | 6/2002 | Oh | |
| 6,632,710 B1 | 10/2003 | Takahashi | |
| 6,809,381 B1 * | 10/2004 | Yoshida | 257/348 |
| 2002/0109187 A1 | 8/2002 | Matsumoto et al. | |

FOREIGN PATENT DOCUMENTS

| | | |
|---|---|---|
| JP | 05-291574 | 11/1993 |
| JP | 06/291265 | 10/1994 |
| JP | 09-260679 | 10/1997 |
| JP | 09260679 | 10/1997 |
| JP | 10-012717 | 1/1998 |
| JP | 11-298001 | 10/1999 |
| JP | 11298001 | 10/1999 |
| JP | 2001-44441 | 2/2001 |

OTHER PUBLICATIONS

Yo-Hwan Koh et al, Body-contacted SOI MOSFET Structure with Fully Bulk CMOS Compatible Layout and Process (3 pp.); IEEE Election Device Letters, vol. 18, No. 3, Mar. 1997.

Yo-Hwan Koh et al, 1Giga Bit SOI DRAM With Fully Bulk Compatible Process and Body-Contacted SOI MOSFET Structure (4 pp.); IEDM Tech. Fig., 1997, pp. 24.1.1-24.1.4.

* cited by examiner

*Primary Examiner*—Douglas W. Owens
(74) *Attorney, Agent, or Firm*—Rabin & Berdo, P.C.

(57) ABSTRACT

A semiconductor device includes a semiconductor substrate, an insulating layer, a silicon layer, full depletion type transistors, and partial depletion type transistors. The insulating layer is formed on the semiconductor substrate. The silicon layer has a first region and a second region. The silicon layer is formed on the insulating layer. The full depletion type transistors are used for a logical circuit, and are formed on the silicon layer at the first region. The partial depletion type transistors are used for a memory cell circuit and are formed on the silicon layer at the second region. The second region of the silicon layer is maintained at a fixed potential.

20 Claims, 5 Drawing Sheets

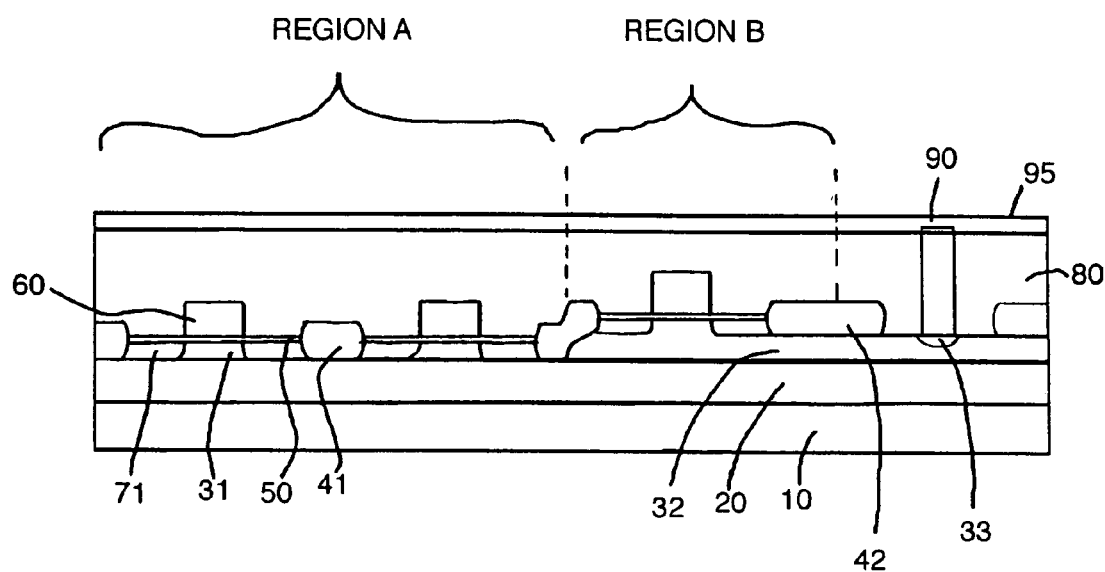

SEMICONDUCTOR MEMORY DEVICE HAVING FULL DEPLETIVE TYPE LOGIC TRANSISTORS AND PARTIAL DEPLETION TYPE MEMORY TRANSISTORS

CROSS-REFERENCE TO RELATED APPLICATION

This application is a division of application Ser. No. 10/059,125, filed Jan. 31, 2002 (now U.S. Pat. No. 6,809,381, issued Oct. 26, 2004), the disclosure of which is incorporated herein by reference.

BACKGROUND OF THE INVENTION

1. Field of the Invention

The invention relates to a semiconductor device and a method of fabricating the same.

This application is a counterpart application of Japanese application Serial Number 313593/2001, filed Oct. 11, 2001, the subject matter of which is incorporated herein by reference.

2. Description of the Related Art

There has been growing attention to be paid to Silicon On Insulator (hereinafter referred to as an SOI) during the development of tomorrow's LSIs which can operate at a low voltage with low power consumption. The SOI technique is a technique for forming elements such as transistors on a silicon layer formed on a insulating layer. A semiconductor device fabricated using this technique has an advantage in that it operates at a low voltage with low power consumption. For an application using the current SOI technique, CMOS and the like is mainstream, and hence the SOI technique is not frequently applied to memory products such as a DRAM. However, there is a demand for low voltage with low power consumption even for memories. It has been difficult to fabricate memories which operate at a low voltage with low power consumption compared with current memories using conventional bulk type transistors. Accordingly, the application of the SOI technique to memories has been studied.

A method of fabricating a full depletion type semiconductor device having a conventional SOI structure is described with reference to FIG. 4(A) to FIG. 4(E).

Firstly, an embedded oxide film layer 20 having a thickness on the order of 1000 to 2000 Å is formed on a silicon substrate 10, and a silicon layer 30 having a thickness on the order of 500 to 1000 Å is formed on the embedded oxide film layer 20, as shown in FIG. 4(A).

Secondly, a pad oxide film 35 having a thickness on the order of 50 to 200 Å is formed on the silicon layer 30, and nitride films 36 each having a thickness on the order of 500 to 3000 Å and having openings on a field oxide film formation region are formed on a remaining pad oxide film 35 using a normal photolithography/etching technique, as shown in FIG. 4(B).

Thirdly, the silicon layer 30 is subjected to a thermal oxidation using the nitride films 36 serving as a mask so as to form field oxide films 40 each having a thickness (on the order of 1000 to 2000 Å) to reach the embedded oxide film layer 20. Thereafter, the remaining nitride films 36 and the remaining pad oxide film 35 are respectively removed to form a shape, as shown in FIG. 4(C).

Fourthly, the silicon layer 30 which are separated in elements (hereinafter referred to as elementally separated) is doped with an impurity so as to render the silicon layer 30 formed on the transistor formation region conductive, as shown in FIG. 4(D).

Lastly, a gate oxide film 50 is formed on the silicon layer 30 on the transistor formation region, then gate electrodes 60 are formed on the gate oxide film 50 using a normal photolithography technique and etching technique. Further, the silicon layer 30 is doped with an impurity using the gate electrodes 60 serving as a mask, thereby forming a source and drain regions 71 of the transistor. As a result, the semiconductor device using the SOI technique is accomplished, as shown in FIG. 4(E).

However, if the forgoing transistor is applied to a transfer gate of a memory cell, electric charges are prone to accumulate in a region under a gate electrode of the transistor (hereinafter referred to as a body region). As a result, there is a likelihood that a source and a drain of the transistor are electrically connected to each other by accumulated electric charges even if no voltage is applied to the gate electrode of the transistor. Under such circumstances, electric charges stored in a capacitor connected to the transistor leak, and hence data stored in the memory cell is destroyed.

Although a threshold value (hereinafter referred to as threshold voltage Vt) of a gate voltage of the SOI transistor is of the order of 1.0 to 1.2 volt, there is a possibility that the threshold voltage Vt becomes not more than 0.7 volt owing to electric charges accumulated in a body region of the transistor. Under such circumstances, the source and the drain are electrically connected to each other, as set forth above, and hence there occurs a phenomenon of a pass gate leakage (sub-threshold leakage) where electric charges accumulated in a capacitor leak, resulting in the occurrence of possibility that data stored in the memory cell is destroyed.

SUMMARY OF THE INVENTION

To solve the forgoing problems, a semiconductor device of the invention has a first silicon layer and a second silicon layer respectively formed on a silicon substrate by way of an insulating layer. Full depletion type transistors for use in a logical circuit are formed on the first silicon layer while partial depletion type transistors for use in a memory cell circuit are formed on the second silicon layer. Further, a potential of the second silicon layer is fixed at a fixed value.

Further, the semiconductor device is fabricated by forming the first and second silicon layers on the insulating layer, forming nitride film patterns on the first and second silicon layers, forming a first element separation film contacting the insulating layer for elementally separating the first silicon layer by subjecting the first and second silicon layers to oxidation using the nitride film patterns serving as a mask, forming a second element separation film on the insulating layer by way of the second silicon layer for elementally separating the second silicon layer, removing the nitride film patterns, forming full depletion type transistors on the first silicon layer and forming partial depletion type transistors on the second silicon layer.

BRIEF DESCRIPTION OF THE DRAWINGS

FIG. 1 is a sectional view of a semiconductor device according to a first embodiment of the invention;

PREFERED ENBODIMENT OF THE INVENTION

First Embodiment

Figure 2A:
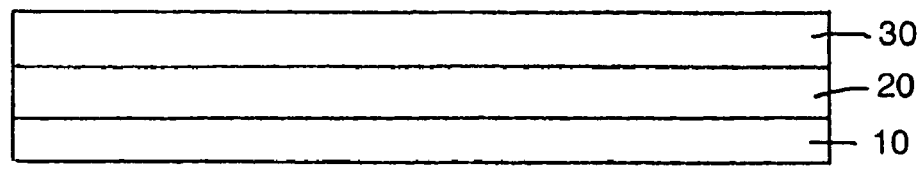
FIG. 2 is a sectional view showing a method of fabricating a semiconductor device according to a second embodiment of the invention.

FIG. 1 is a sectional view of a semiconductor device according to a first embodiment of the invention. The first embodiment of the invention is described with reference to FIG. 1.

With the semiconductor device according to the first embodiment of the invention, there are provided full depletion type transistors for use in a logical circuit on a region A of an SOI substrate, and partial depletion type transistors for use in a memory circuit on a region B. Further, a silicon layer 32 on which the partial depletion type transistors are formed is fixed in potential.

The logical circuit used here is a circuit for executing fixed operations relative to the combination of inputted logical values and outputting the result of the operations. There are two types of logical circuits. The first is a combinational logical circuit in which the combination of the logical values to be outputted is determined only by the combination of the logical values to be inputted, and the second is a sequential logical circuit in which the combination of the logical values to be outputted are also affected by the state of the logical circuit when the logical values are inputted. According to the first embodiment, a circuit for operating data to be inputted to a memory and a circuit for operating data to be outputted from the memory are respectively included as the logical circuit. Meanwhile, a DRAM, an SRAM, a flash memory and the like can be included as the memory circuit.

The SOI substrate has an embedded oxide film layer 20 provided on the silicon substrate 10 while a silicon layer 31 and another silicon layer 32 provided on the embedded oxide film layer 20. The SOI substrate also has a first field oxide film 41 which is in contact with the embedded oxide film layer 20 and elementally separates the silicon layer 31, and a second field oxide film 42 which does not reach the embedded oxide film layer 20 and elementally separates the silicon layer 32. Transistors are formed on the silicon layer 31 and the silicon layer 32 which are respectively elementally separated by the first field oxide film 41 and the second field oxide film 42. Each transistor has a gate oxide film 50 formed on the silicon layer 31 or silicon layer 32 and a gate electrode 60 formed on the gate oxide film 50, and also has source and drain regions 71 and a channel region. The thickness of the silicon layer 32 is larger than that of the silicon layer 31. The gate electrodes 60, and the first and second field oxide films 41, 42 are covered with an interlayer insulating film 80 formed of a BPSG (boron phosphorus silicate glass) and SiO2. Further, the source and drain regions 71 of the transistors formed on the silicon layer 32 are electrically connected to a capacitor, not shown, corresponding to the source or drain.

Further, a contact 90, which penetrates the interlayer insulating film 80, contacts the surface of the silicon layer 32, and is made of poly-silicon or tungsten, is provided so as to fix the potential of the silicon layer 32. A high concentration layer or region 33 is doped with a conductive impurity which is the same as the silicon layer 32 at the portion where the contact 90 contacts the impurity in the silicon layer 32 at concentration higher than that of the impurity of the silicon layer 32. The diameter of the contact 90 is of the order of 0.3 to 0.4 µm. The contact 90 is formed on the surface of the interlayer insulating film 80 and made of aluminum or copper. Further, the contact 90 is connected to an upper layer wiring 95 which is grounded or connected to a constant potential source so that the potential of the silicon layer 32 is fixed at a fixed value.

With the semiconductor device according to the first embodiment of the invention, since the second field oxide film 42 does not reach the embedded oxide film layer 20, respective partial depletion type transistors formed on the silicon layer 32 are electrically connected to each other on a body region (a region under the channel region). That is, the potential of the body region is fixed by a well contact (the body region is electrically connected to a constant voltage source). Accordingly, the electric charges are not accumulated in the body region of the transistors formed on the silicon layer 32. As a result, there does not occur a case where the source and drain of each transistor formed on the silicon layer 32 are electrically connected to each other by the accumulated electric charges even if no voltage is applied to the gate of the transistor formed on the silicon layer 32. Accordingly, there does not occur a pass gate leakage (a phenomenon where electric charges stored in a capacitor of a memory leak by way of a transfer gate), so that there is an advantage in that information stored in the memory cell can be held with certainty.

Meanwhile, the first field oxide film 41 reaches the embedded oxide film layer 20 so as to completely elementally separate the silicon layer 31. Further, the transistors formed on the silicon layer 31 are full depletion type transistors to be used in a logical circuit. Accordingly, the threshold voltage Vt of the transistor can be set at a value lower than that of the partial depletion type transistors so that the transistors can be operated at a low voltage. That is, the advantage of the transistor using the conventional SOI technique is not lost.

In order to prevent the pass gate leakage, in cases where the source and drain region 71 of the transistor is a conductive N-type and the threshold value of the gate voltage thereof is of the order of 1.0 to 1.2 V, the potential of the silicon layer 32 in the vicinity of the embedded oxide film layer 20 may be kept at not more than 0 V by grounding the silicon layer 32 or connecting the silicon layer 32 to a constant potential source.

Further, although not illustrated, the silicon layer 31 and the silicon layer 32 are spaced from each other and a peripheral circuit may be disposed therebetween.

If the high concentration layer 33 is formed in a wider range so as to contact the embedded oxide film layer 20, the electric charges accumulated in the body region can efficiently escape through the contact 90 because the high concentration layer 33 is low in resistance compared with the peripheral layers.

Second Embodiment

FIG. 2(A) to FIG. 2(G) are sectional views showing steps of fabricating a semiconductor device according to a second embodiment of the invention. The second embodiment of the invention is described with reference to FIG. 2(A) to FIG. 2(G). The second embodiment is a method of fabricating the semiconductor device as set forth in the first embodiment of the invention.

Firstly, an embedded oxide film layer 20 having a thickness on the order of 1000 to 2000 Å, then a silicon layer 30 having a thickness on the order of 2000 to 4000 Å are sequentially formed on a silicon substrate 10, as shown in FIG. 2(A).

Figure 2B:
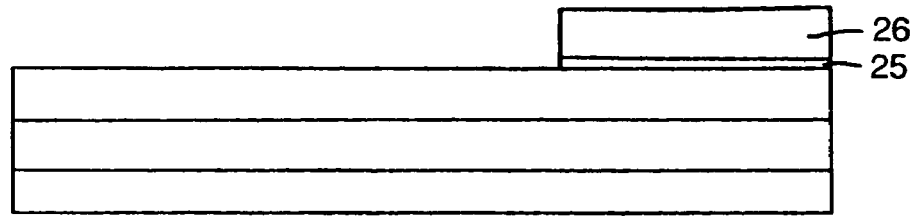

Secondly, a first pad oxide film 25 having a thickness on the order of 50 to 200 Å is formed on the silicon layer 30, and a first nitride film 26 having a thickness on the order of 500 to 3000 is formed on the first pad oxide film 25, thereby obtaining the shape as shown in FIG. 2(B).

Figure 2C:
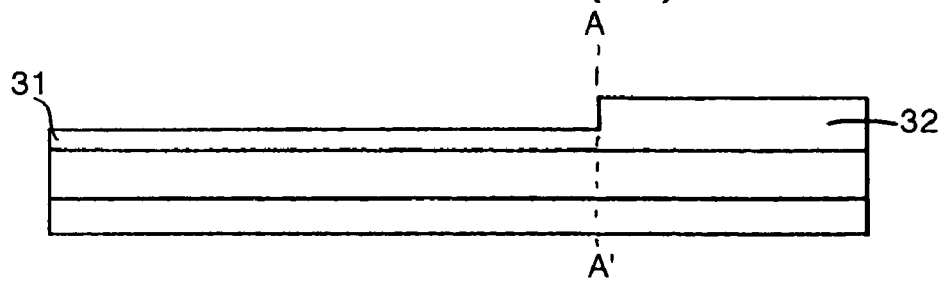

Thirdly, a part of the silicon layer 30 is etched using a normal etching technique and also using the first pad oxide film 25 and the first nitride film 26 serving as a mask. The silicon layer 30 has a portion which is etched along the boundary depicted by the dotted line A–A' and a portion which is not etched. The portion which is etched becomes the silicon layer 31 while the portion which is not etched becomes the silicon layer 32. The silicon layer 31 at the left side of the line A–A' in FIG. 2(C) is a portion where full depletion type transistors are formed by the later steps while the silicon layer 32 at the right side of the line A–A' in FIG. 2(C) is a portion where partial depletion type transistors are formed by the later steps. Then, the first pad oxide film 25 and the first nitride film 26 are removed. As a result, the silicon layer 32 and the silicon layer 31 which is thinner than the silicon layer 32 are respectively formed on the embedded oxide film layer 20, thereby obtaining the shape as shown in FIG. 2(C).

Figure 2D:
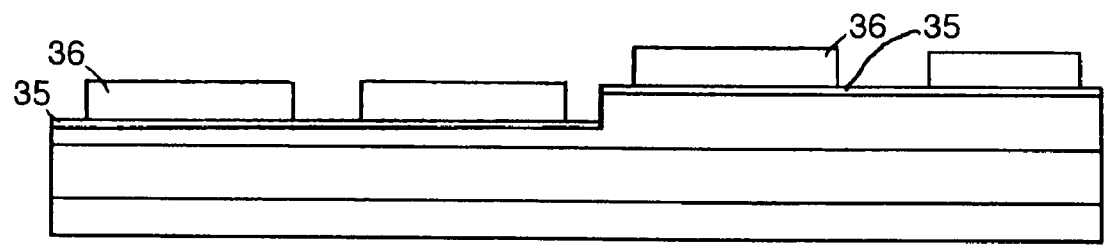
Figure 2E:
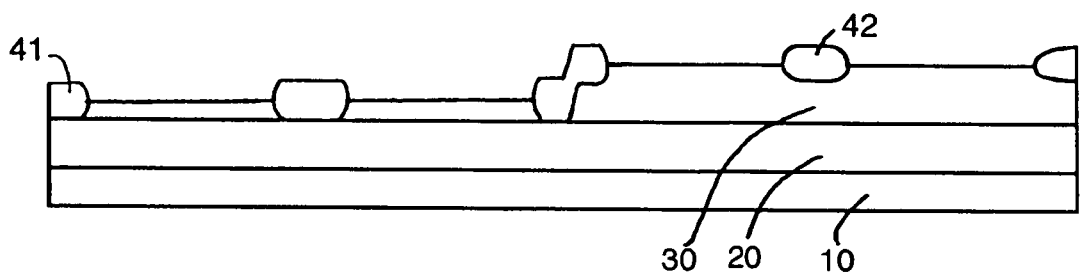

Subsequently, a second oxide film 35 on the order of 50 to 200 Å is formed on the silicon layer 31 and the silicon layer 32, then a second nitride film 36 on the order of 500 to 3000 Å is formed on the pad oxide film 35, thereby obtaining the shape as shown in FIG. 2(D).

Then, both the silicon layer 31 and the silicon layer 32 are subjected to a thermal oxidation using the nitride film 36 serving as a mask. By the thermal oxidation, a part of the silicon layer 31 becomes a first field oxide film 41 having a thickness to reach the embedded oxide film layer 20 while a part of the silicon layer 32 becomes a second field oxide film 42 not to reach the embedded oxide film layer 20. Thereafter, both the second nitride film 36 and the second pad oxide film 35 are removed. Accordingly, the silicon layer 31 is elementally separated by the first field oxide film 41 while the silicon layer 32 is elementally separated by the second field oxide film 42, thereby obtaining the shape shown in FIG. 2(E).

Figure 2F:
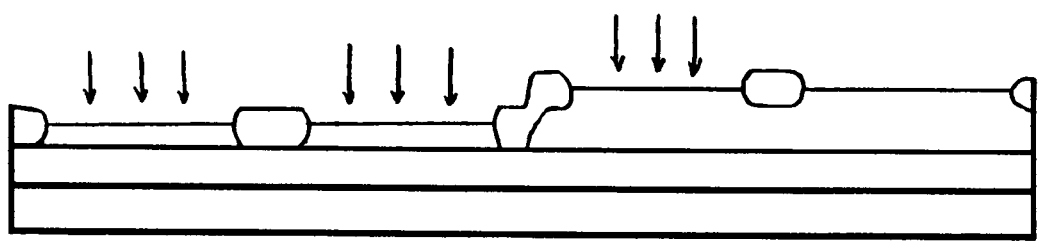

Subsequently, the silicon layers 31, 32 which are respectively elementally separated by the first field oxide films 41, 42 are respectively doped with impurities as shown in FIG. 2(F). The concentration of impurity to be doped at this time is of the order of $1 \times 10^{12} \sim 1 \times 10^{13}$ cm$^{-2}$ if each channel forms a p-type transistor.

Finally, a gate oxide film 50 is formed on the silicon layer 31 and the silicon layer 32, then a gate electrode 60 made of poly-silicon is formed on the gate oxide film 50, while when the silicon layer 31 and the silicon layer 32 are doped with the impurities using the gate electrode 60 serving as a mask, a source and drain region 71 and a channel region 72 of the transistor are formed. At this time, the transistor is not formed on a part of the silicon layer 32 which is elementally separated by the second field oxide film 42. However, a high concentration layer 33 having a region with high concentration in an impurity on the order of $1 \times 10^{15} \sim 1 \times 10^{15}$ cm$^{-2}$ is formed on the silicon layer 32 on which the transistor is not formed. After forming the transistors, an interlayer insulating film 80 made of BPSG or SiO$_2$ is formed on the gate electrode 60 or the first and second field oxide films 41, 42. A contact 90 which is electrically connected to the silicon layer 32 and made of poly-silicon or tungsten is formed on the silicon layer 32, on which the transistor is not formed, by penetrating the interlayer insulating film 80. The contact 90 has a diameter on the order of 0.3 to 0.4 μm. An upper layer wiring 95 made of aluminum or copper is formed on the surface of the interlayer insulating film 80.

The potential of the upper layer wiring 95 is grounded or connected to a constant potential source, thereby always keeping its potential at not more than 0V.

Figure 2G:
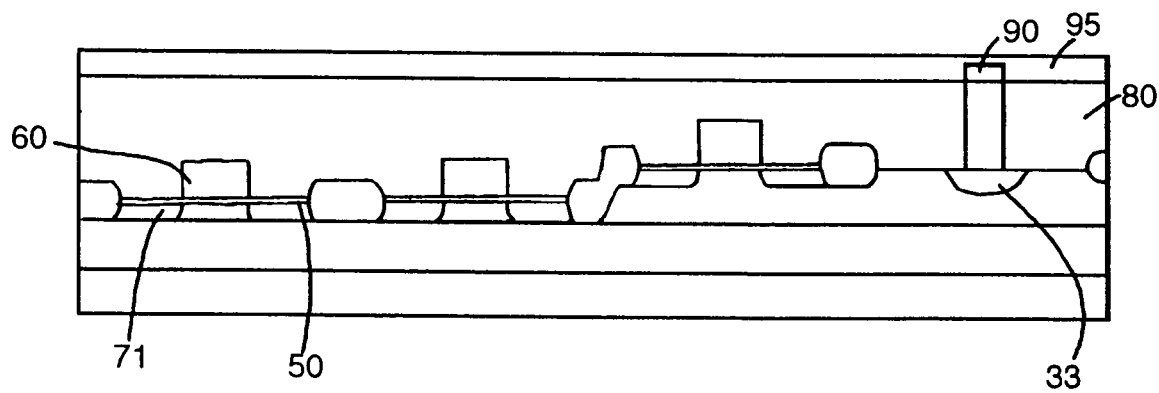

As mentioned in detail above, the semiconductor device according to the first embodiment of the invention is accomplished while it has the transistor formed on elementally separated silicon layer 31 and the transistor and the contact formed on the elementally separated silicon layer 32, as shown in FIG. 2(G).

The semiconductor device according to the first embodiment which is fabricated according to the method of the second embodiment has the silicon layer 32 having a thickness larger than that of the silicon layer 31, thereby obtaining an advantage that a well contact is easily made on the transistor formed on the silicon layer 32.

The region where full depletion type transistors are formed and the region where partial depletion type transistors are formed can be simultaneously elementally separated from each other by forming the first field oxide film 41 and second field oxide film 42 each having the same thickness at one step.

Meanwhile, if the high concentration layer 33 is formed in a wider rage so as to contact the embedded oxide film layer 20, the electric charges accumulated in the body region can be efficiently escaped through the contact 90 because the high concentration layer 33 is low in resistance compared with the peripheral layers. Particularly, the embedded oxide film layer 20 is positioned under the silicon layer 32 according to the invention. Accordingly, it is possible to prevent ion, with which the silicon layer 32 is doped from being excessively diffused downward so as to form the high concentration layer 33. As a result, it is possible to form the high concentration layer 33 in a wider range so as to contact the embedded oxide film layer 20 with ease.

Third Embodiment

FIG. 3(A) to FIG. 3(E) are sectional views showing a third embodiment of the invention. The third embodiment of the invention is described with reference to FIG. 3(A) to FIG. 3(E). The third embodiment of the invention corresponds to the second embodiment of the invention which is the method of fabricating the semiconductor device of the first embodiment of the invention, and it is the modification of the second embodiment.

Figure 3A:
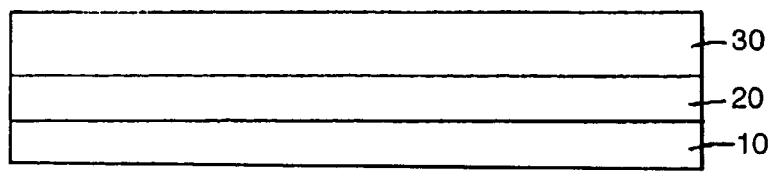
FIG. 3 is a sectional view showing a method of fabricating a semiconductor device according to a third embodiment of the invention.

Firstly, an embedded oxide film layer 20 having a thickness on the order of 1000 to 2000 Å, then a silicon layer 30 having a thickness on the order of 2000 to 4000 Å are respectively formed on a silicon substrate 10 as shown in FIG. 3(A). This step is the same of that of the second embodiment.

Figure 3B:
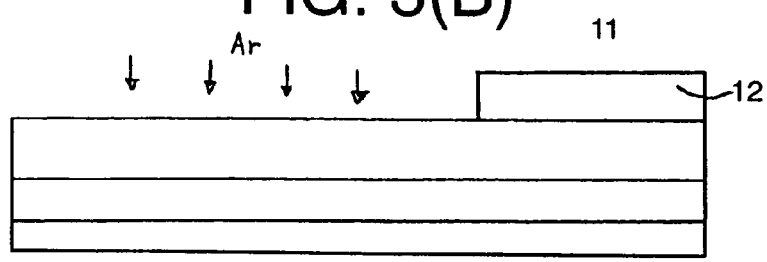

Secondly, a resist 12 is selectively formed on the surface of the silicon layer 30, as shown in FIG. 3(B), and the silicon layer 30 is doped with Ar using the resist 12 serving as a mask under the condition of an acceleration electric field on the order of 10 to 30 KeV, with density on the order of $1 \times 10^{14} \sim 1 \times 10^{15}$ cm$^{-2}$. B or P can be selected instead of Ar.

Figure 3C:
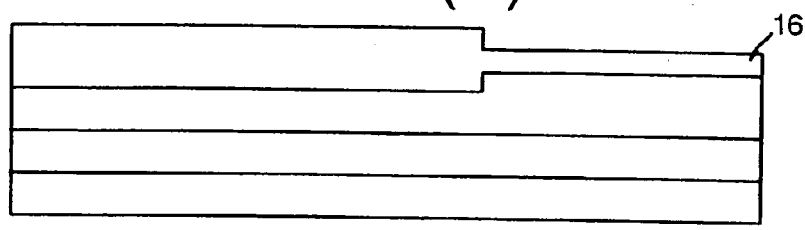

Thirdly, the resist 12 is removed, and a thermal oxide film 16 having a thickness on the order of 2000 to 5000 Å is formed on the silicon layer 30. At this time, the thermal oxide film 16 grows faster at a region doped with an impurity than at a region not doped with the impurity owing to growth speed diffusion effect. As a result, the thermal oxide film 16 has a shape as shown in FIG. 3(C).

Figure 3D:
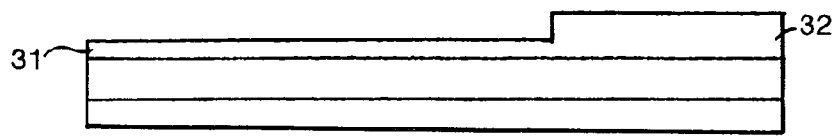

Fourthly, the thermal oxide film 16 is removed so that a silicon layer 32 and a silicon layer 31 which is thinner than the silicon layer 32 are respectively formed on the embedded oxide film layer 20, thereby obtaining a shape as shown in FIG. 3(D).

Figure 3E:
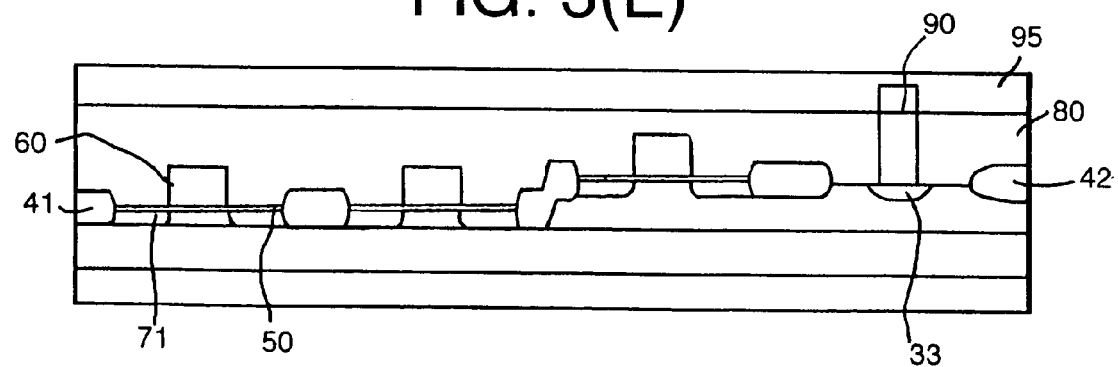
Figure 4A:
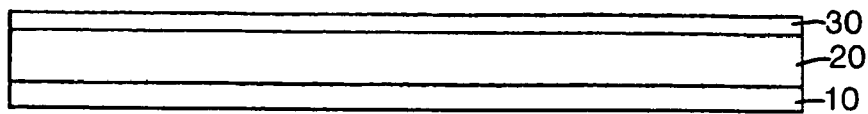
FIG. 4 is a sectional view showing a conventional semiconductor device and a method of fabricating the same.
Figure 4B:
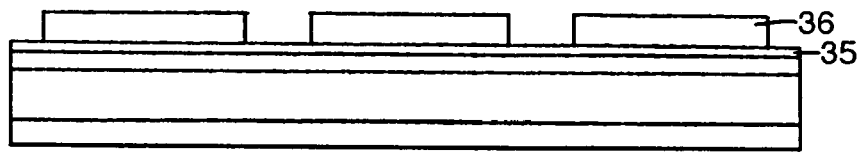
Figure 4C:
Figure 4D:
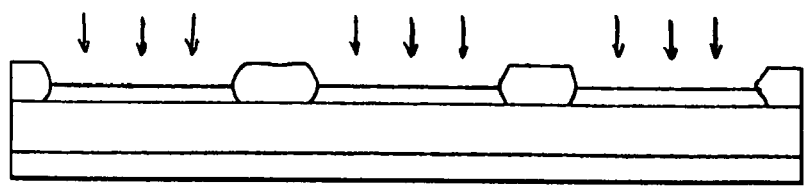
Figure 4E:
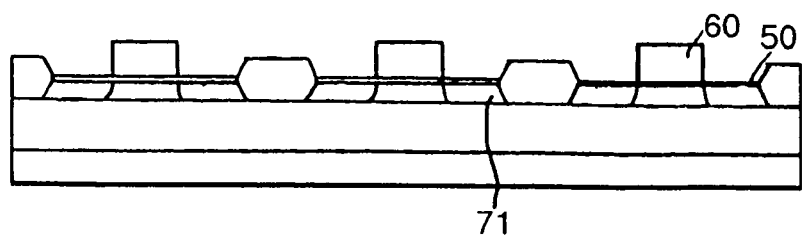

The subsequent steps are the same as those shown in FIG. 2(D) to FIG. 2(G) of the second embodiment of the invention. Finally, the semiconductor device as shown in FIG. 3(E) is obtained in the same way as the second embodiment of the invention.

The third embodiment of the invention obtains the same advantage as the second embodiment. Further, it is not necessary to form the first pad oxide film 25 in the second embodiment, so that the steps can be reduced or simplified compared with those of the second embodiment.

As explained in detail above, according to the semiconductor device of the invention, the partial depletion type transistors formed on the second silicon layer are used for a memory circuit. The transistors formed on the second silicon layer are electrically connected to each other at the body region. Accordingly, there does not occur a pass gate leakage because a potential of the transistors formed on the second silicon layer can be fixed to the body region owing to the well contact. Accordingly, although the transistors are fabricated using an SOI technique according to the invention, there is an advantage that information of cell data can be held with certainty even if the transistors are used for a transfer gate of a memory. The full depletion type transistors formed on the first silicon layer are used for a logical circuit. The transistors formed on the first silicon layer are of full depletion type and they are completely elementally separated with each other. Accordingly, a threshold voltage Vt of the full depletion type transistors can be set at a value lower than the partial depletion type transistor so that there is an advantage that the transistor can operate at a low voltage. That is, the advantage of the conventional semiconductor device is not lost.

If the method of fabricating the semiconductor device according to the invention is employed, the thickness of the second silicon layer becomes larger than that of the first silicon layer, there is an advantage that a well contact can be easily made on the transistor formed on the second silicon layer.

What is claimed is:

1. A semiconductor device comprising:
    a semiconductor substrate;
    an insulating layer formed on the semiconductor substrate;
    a silicon layer formed on the insulating layer, the silicon layer having a first region and a second region, the first region of the silicon layer having a plurality of first element regions and the second region of the silicon layer having a plurality of second element regions;
    an element isolation layer formed on the silicon layer, the element isolation layer completely isolating the first element regions from each other and isolating the second element regions from each other only at a surface of the second region of the silicon layer, the element isolation layer additionally isolating the first region of the silicon layer from the second region of the silicon layer;
    a plurality of full depletion type transistors used for a first circuit each formed on the silicon layer at the first region; and
    a plurality of partial depletion type transistors used for a second circuit each formed on the silicon layer at the second region, the silicon layer in the second region being applied with a predetermined potential.

2. The semiconductor device according to claim 1, wherein the thickness of the silicon layer at the second region is thicker than that of the silicon layer at the first region.

3. The semiconductor device according to claim 1, wherein the element isolation layer has a first thickness in the first region so that the silicon layer in the first region is completely isolated, wherein the element isolation layer has a second thickness between the first and second regions so that the silicon layer in the first region is completely isolated from the silicon layer in the second region, and wherein the element isolation layer has a third thickness in the second region so that the silicon layer in the second region is partly isolated.

4. The semiconductor device according to claim 3, wherein the first thickness is thicker than a thickness of the silicon layer in the first region.

5. The semiconductor device according to claim 3, wherein the second thickness is thicker than a thickness of the silicon layer in the second region.

6. The semiconductor device according to claim 3, wherein the third thickness is thinner than a thickness of the silicon layer in the second region.

7. The semiconductor device according to claim 3, further comprising a constant potential source, wherein the silicon layer is electrically connected to the constant potential source at the second region so that the silicon layer is kept at a fixed potential at the second region.

8. The semiconductor device according to claim 7, further comprising a high concentration region formed on the silicon layer at the second region, the high concentration region being doped with an impurity at concentration higher than the silicon layer, wherein the silicon layer at the second region is connected to the constant potential source through the high concentration region.

9. The semiconductor device according to claim 1, wherein the silicon layer is a conductive P-type at the second region, while a threshold value of a gate voltage of the partial depletion type transistor is of the order of 1.0 to 1.2 V, and the silicon layer is grounded at the second region.

10. A semiconductor device comprising:
    a semiconductor substrate;
    an insulating layer formed on the semiconductor substrate;
    a first silicon layer and a second silicon layer formed on the insulating layer, the first silicon layer having a plurality of first element regions and the second silicon layer having a plurality of second element regions;
    an element isolation layer formed on the first and second silicon layers, the element isolation layer completely isolating the first element regions from each other and isolating the second element regions from each other only at a surface of the second silicon layer;
    a plurality of full depletion type transistors used for a first circuit formed on the first silicon layer; and
    a plurality of partial depletion type transistors used for a second circuit formed on the second silicon layer, wherein the second silicon layer is fixed at a fixed potential.

11. The semiconductor device according to claim 10, wherein the thickness of the second silicon layer is thicker than the first silicon layer.

12. The semiconductor device according to claim 10, wherein the element isolation layer includes a first element isolation film formed to contact the insulating layer for elementally isolating the first silicon layer into a plurality of first island regions; and
    a second element isolation film formed on the second silicon layer for elementally isolating the second silicon layer into a plurality of second island regions.

13. The semiconductor device according to claim 10, further comprising a constant potential source, wherein the second silicon layer is electrically connected to the constant potential so that the second silicon layer is kept at a fixed potential at the second region.

14. The semiconductor device according to claim 13, further comprising a high concentration region formed on the second silicon layer, the high concentration region being doped with an impurity at concentration higher than the second silicon layer, wherein the second silicon layer is connected to the constant potential source through the high concentration region.

15. The semiconductor device according to claim 14, wherein the second silicon layer is a conductive P-type, while a threshold value of a gate voltage of the partial depletion type transistor is of the order of 1.0 to 1.2 V, and the second silicon layer is grounded.

16. A semiconductor device comprising:
a semiconductor substrate having an insulating layer formed thereon, the semiconductor substrate having a first area and a second area;
a silicon layer formed on the insulating layer, the silicon layer having a plurality of first element regions above the first area of the substrate and a plurality of second element regions above the second area of the substrate;
an element isolation layer formed on the silicon layer, the element isolation layer completely isolating the first element regions from each other and isolating the second element regions from each other only at a surface of the silicon layer, the element isolation region additionally isolating a portion of the silicon layer where the first element regions are disposed from a portion of the silicon layer where the second element regions are disposed;
a plurality of fully depleted transistors formed on the silicon layer above the first area, the fully depleted transistors being used for a first circuit;
a plurality of partially depleted transistors formed on the silicon layer above the second area, the partially depleted transistors being used for a second circuit; and
a potential applying region formed on the silicon layer above the second area, the potential applying region having a high concentration area for applying a predetermined potential to the silicon layer,
wherein the silicon layer of the potential applying region is connected to the silicon layer at which one of the partially depleted transistors is formed.

17. A semiconductor device according to claim 16, wherein the silicon layer at which the potential applying region is formed and the silicon layer at which one of the partially depleted transistors is formed extends under a LOCOS layer.

18. A semiconductor device according to claim 16, wherein the element isolation layer is a LOCOS insulating layer.

19. A semiconductor device according to claim 18, wherein the LOCOS layer in the first area is contacted with the insulating layer and the LOCOS layer in the second area is formed on the silicon layer.

20. The semiconductor device according to claim 16, wherein the potential applying region is a conductive P-type, while a threshold value of a gate voltage of the partial depletion type transistor is of the order of 1.0 to 1.2 V, and the silicon layer at the second area is grounded.

* * * * *